United States Patent [19]
Chung et al.

[11] Patent Number: 5,932,875
[45] Date of Patent: Aug. 3, 1999

[54] SINGLE PIECE INTEGRATED PACKAGE AND OPTICAL LID

[75] Inventors: Randall M. Chung, Laguna Niguel; Robert L. Mifflin, Fallbrook, both of Calif.

[73] Assignee: Rockwell Science Center, Inc., Thousand Oaks, Calif.

[21] Appl. No.: 08/888,817

[22] Filed: Jul. 7, 1997

[51] Int. Cl.[6] .................................................. H01J 5/02
[52] U.S. Cl. ............................................ 250/239; 257/433
[58] Field of Search ...................................... 250/239, 216, 250/208.1, 214.1; 257/81, 82, 431–434

[56] References Cited

U.S. PATENT DOCUMENTS

| | | | |
|---|---|---|---|
| 5,130,531 | 7/1992 | Ito et al. | 257/434 |
| 5,453,638 | 9/1995 | Nagele et al. | 257/433 |
| 5,567,972 | 10/1996 | Abe | 257/433 |
| 5,691,536 | 11/1997 | Shimoyama et al. | 250/239 |
| 5,783,815 | 7/1998 | Ikeda | 250/239 |

*Primary Examiner*—Que T. Le
*Attorney, Agent, or Firm*—Joseph W. King, Jr.

[57] ABSTRACT

A lid for protecting and covering an integrated circuit provided in a chip-on-board package is disclosed. The lid has a wall surrounding the integrated circuit, and a top cover covering the integrated circuit, with the wall and top cover provided in a single piece.

28 Claims, 1 Drawing Sheet

SINGLE PIECE INTEGRATED PACKAGE AND OPTICAL LID

BACKGROUND OF THE INVENTION

1. Field of the Invention

The present invention relates generally to chip-on-board optical packaging, and in particular, to an optical lid for use as a protective package and transparent lid for an image sensor provided on a board.

2. Background Art

Chip-on-board optical packaging is well-known in the art, and involves directly attaching an integrated circuit (which can be an image sensor) to a board, instead of providing the integrated circuit in the form of an encapsulated chip that needs to be soldered to the board. As a result, the bond wires that are used to bond the integrated circuit to the board are exposed and must be protected from damage. There are two known packaging approaches to protecting the image sensor integrated circuit in a chip-on-board environment.

The first approach provides a two-piece package, where a molded plastic ring is attached to the board surrounding the image sensor, and a clear plastic or glass lid is then attached to the ring. The ring and lid therefore takes the form of a hat with a clear top which functions as a package to protect the image sensor and its bond wires from damage. However, this approach suffers from several drawbacks. First, the existence of two joints, one between the ring and the board, and the other between the ring and the lid, makes it difficult to manufacture the entire assembly of the board, ring and lid. Second, the delicate manner of the assembly of the two pieces (ring and lid) increases the cost of production.

According to the second approach, the molded plastic ring is first attached to the board surrounding the image sensor, and a transparent molding compound, such as a clear epoxy, is then poured into the ring to encapsulate the image sensor. This approach also suffers from some drawbacks. First, there is the possibility of generating bubbles in the molding compound. Second, it is also difficult to keep the outer surface of the molding compound flat to ensure co-planarity with the lens of the image sensor, since distortions may form on the outer surface. Third, the materials for the molding compound are easily scratched. All of these problems would impair the optical performance of the image sensor.

SUMMARY OF THE INVENTION

It is an object of the present invention to provide an improved packaging for protecting an integrated circuit, or image sensor, in a chip-on-board environment.

It is another object of the present invention to provide a protective packaging having a lid that is optically flat and is co-planar with the lens of the protected image sensor.

It is yet another object of the present invention to provide a protective packaging having a lid that can also act as an optical element of a lens assembly.

It is a further object of the present invention to provide a protective packaging having one or more coatings deposited on a lid for anti-reflection, infra-red or other filtration purposes.

It is a further object of the present invention to provide a protective packaging having a lid on which a lens mount can be mounted.

The present invention provides a lid for protecting and covering an integrated circuit provided in a chip-on-board package. The lid has a wall surrounding the integrated circuit, and a top cover covering the integrated circuit, with the wall and top cover provided in a single piece. The wall and top cover may be molded into a single piece. In a preferred embodiment, the integrated circuit may be an image sensor.

In accordance with one embodiment of the present invention, the integrated circuit is provided on a PC board in a chip-on-board package. The lid further includes a flange extending radially outwardly from the bottom of the wall and having a bottom surface that is attached to the PC board around the integrated circuit. The flange may be provided as a single piece together with the wall and top cover.

In another embodiment of the present invention, the top cover may include a lens element.

In yet another embodiment of the present invention, at least one filter layer may be deposited on the top cover. The filter may be an infrared filter or an anti-reflection filter.

In a further embodiment of the present invention, a lens mount may be attached to the lid.

The present invention also provides a method of manufacturing a chip-on-board integrated circuit, including the steps of attaching a chip-on-board integrated circuit to a PC-board, providing a lid having a wall and a top cover that are provided in a single piece, positioning the lid on the PC board at a desired position so that the wall surrounds the integrated circuit and the top cover covers the integrated circuit, and attaching the lid to the PC board at the desired location.

Further objects and advantages of the present invention will become apparent to those skilled in the art upon reading and understanding of the following detailed description and the accompanying drawings.

DETAILED DESCRIPTION OF THE INVENTION

In the following description, for purposes of explanation and not limitation, specific details are set forth in order to provide a thorough understanding of the present invention. However, it will be apparent to one skilled in the art that the present invention may be practiced in other embodiments that depart from these specific details. In certain instances, detailed descriptions of well-known data processing techniques, devices and circuits are omitted so as to not obscure the description of the present invention with unnecessary detail.

The present invention provides a single piece of optical quality material to act as a protective package, a transparent lid, a possible optical lens element, a possible substrate for infrared, anti-reflection or other filtration coatings, and a potential attachment point for additional lens elements.

Figure 2:
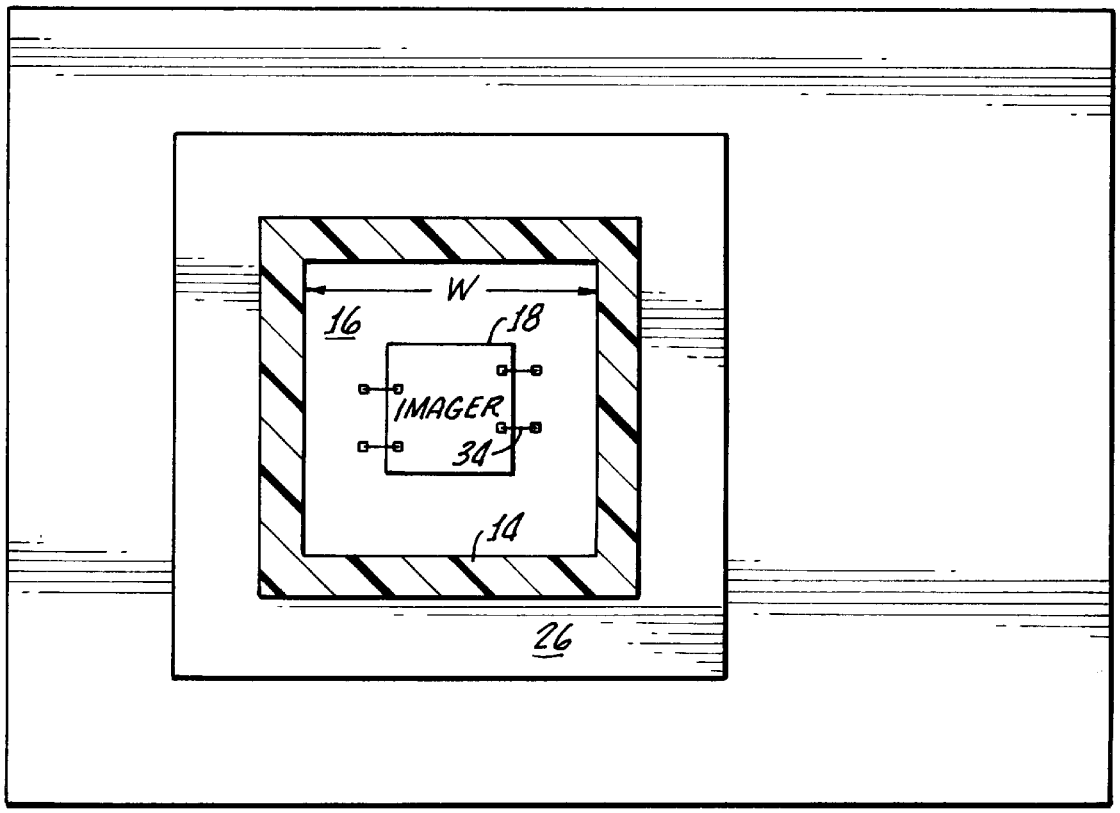
FIG. 2 is a top view of the lid and image sensor of FIG. 1.
Figure 1:
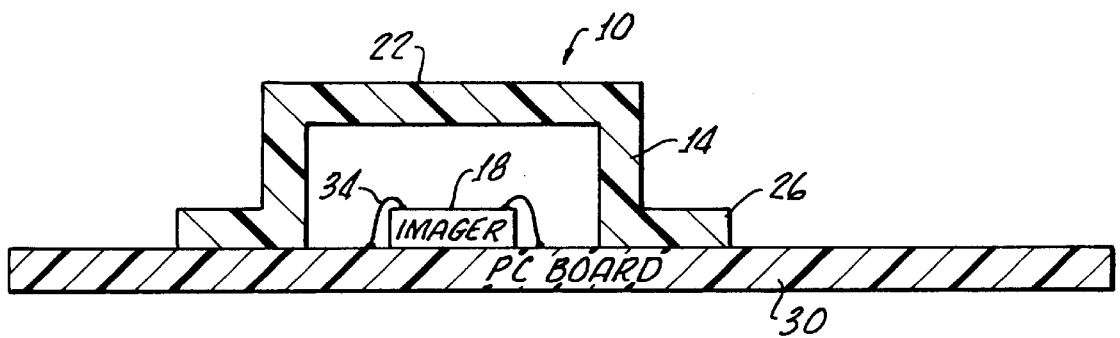
FIG. 1 is an enlarged sectional view of a protective optical lid according to the present invention shown in use with an image sensor in a chip-on-board environment.

Referring to FIGS. 1 and 2, a lid 10 is provided as a single-piece having a configuration similar to that of a "top hat" with a generally square or rectangular shape. The lid 10 has a wall 14 surrounding an image sensor 18, a top cover 22 extending radially inwardly from the top of the wall 14 to cover the image sensor 18, and a flange or brim 26 extending radially outwardly from the bottom of the wall 14. The wall 14, top cover 22 and flange 26 are provided in a single integral piece to form the lid 10.

The lid 10 is preferably made by molding a single piece from a material which is easy to mold, is clear or transparent, is scratch-resistant, has a relatively high plastic transition temperature, is dimensionally stable, and is generally compatible with adhesives. Such materials can include, but is not limited to, plastics, polycarbonates, and acrylics. The lid 10 can also be machined out of a chunk of plastic or other suitable material, with the top and bottom of the top cover 22 polished. In addition, although the lid 10 is described as having a generally square or rectangular shape, those skilled in the art will appreciate that the lid 10 can assume any desired shape which is easy to mold and which provides maximum protection for the image sensor 18.

The flange 26 of the lid 10 is attached to a PC board 30 by using an adhesive such as epoxy. Conventional epoxies such as thermal-setting epoxy and ultraviolet-curing epoxy can be used, although those skilled in the art will appreciate that other conventional expoxies and adhesives can also be used. The flange 26 provides a wider base surface area for attachment of the lid 10 to the PC board 30, but can be omitted, in which case the adhesive would be applied to the bottom of the wall 14.

The image sensor 18 is provided on the PC board 30 according to chip-on-board packaging methods that are known in the art. Wire bonds 34 connect the image sensor 18 to the PC board 30. The image sensor 18 can be any kind of image sensing device, such as charge-coupled devices (CCD) and CMOS devices.

Thus, the lid 10 acts as a protective packaging for the image sensor 18. The wall 14 and top cover 16 surround and enclose the image sensor 18 to prevent damage to the image sensor 18 and the wire bonds 34. The top cover 16 is preferably transparent and flat, and functions as both a cover and a window.

In accordance with one aspect of the present invention, the lid 10 of the present invention can also be provided as an optical lens element. In this embodiment, the tooling for the lid 10 can be designed to provide the necessary curvature for the top cover 22 to act as an optical lens element. The top cover 22 or lens is still molded or otherwise provided in a single piece with the lid 10, and can be made from the same material as the wall 14 and flange 26.

In accordance with another aspect of the present invention, the lid 10 of the present invention can also be provided with one or more coatings. Specifically, either surface of the top cover 22 can be provided with a coating. In one embodiment, an infrared filter can be deposited on either or both surfaces of the top cover 22. The material of this filter can be a thin-film interference filter. This filter can be deposited according to one of a number of methods. For example, a plurality (i.e., 30–40) of thin films or coatings can be applied to either or both surfaces of the top cover 16 while in a vacuum chamber. The films or coatings are made of materials having different indexes of refraction, which cause destructive and constructive interference of the infrared light passing through the films, causing the infrared light to cancel out with a filtering effect.

The deposition of the infrared filter to either or both surfaces of the top cover 22 of the the lid 10 also improves the optical performance of the image sensor 18. Since silicon sensors are sensitive to infrared, prior methods have attempted to filter out the infrared by adding infrared filter glass in front of or behind a lens. Not only does this increase the cost of the assembly, but adding additional elements (i.e., the filter glass pieces) between the image sensor and the object diminishes the amount of light received by the image sensor because of the air gaps created between the optical elements, thereby impacting the performance of the image sensor. The coatings deposited on the top cover 22 save the cost of an additional single-purpose element, and ensure that the number of elements, and air gaps, between the image sensor and the object is minimized.

In addition to infrared filters, anti-reflection and other filters can also be deposited on either or both surfaces of the top cover 22 using conventional methods known to those skilled in the art.

In accordance with yet another aspect of the present invention, the top cover 22 of the lid 10 can act as a mounting structure or support for the lens or a lens mount. This feature allows a lens or lens mount to be attached to the top cover 22 in a manner which maintains the co-planarity between the image sensor 18 and the lens to be mounted to the lid 10.

The lid 10 can be provided with a uniform thickness throughout its wall 14, flange 26 and top cover 22. However, it is possible to provide different thicknesses at different parts of the lid 10. For example, it may be desirable to have a thicker wall 14 if a lens is to be mounted to the lid 10, so as to provide additional support and strength for the lens mounting.

A few non-limiting dimensions are set forth herein. In one embodiment, the thickness of the lid 10 is about 2 mm, and the flange 26 extends radially outwardly for a distance of about 2 mm. The lid 10 has an internal width W of about 14 mm (see FIG. 2).

The combined PC-board 30, image sensor 18, and lid 10 according to the present invention may be manufactured according to the following method. In a first step, the desired coatings or films are deposited or otherwise applied on the top cover 22 before the lid 10 is attached to the PC-board 30. In a second step, all of the components of the PC-board 30, except for the image sensor 18, are attached to the PC-board 30 using conventional solder processes. The image sensor 18 is attached after all the other components because the heat from soldering can be as high as 250 degrees Celcius, which can damage the color filters provided on the image sensor 18. In a third step, epoxy, such as thermal set epoxy, is used to attach the image sensor 18 to the PC board 30, and the wire bonds 34 are bonded to the PC board 30.

The PC board 30 is now ready for receiving the lid 10. In a fourth step, epoxy is placed on the bottom of flange 26 of lid 10, or on the PC board 30 at the desired location of the lid 10. If the flange 26 has been omitted, the epoxy may be placed on the bottom of the wall 14. In a fifth step, a robotic pick-and-place places the lid 10 on the PC board 30 at the desired position covering the image sensor 18. In a sixth step, the epoxy applied to the bottom of the flange 26 is cured by applying ultraviolet light.

Although the lid 10 of the present invention has been described as being provided for use in protecting and covering an image sensor 18, those skilled in the art will appreciate that the lid 10 can also be used to protect and cover other integrated circuits.

Although certain components have been described above as including certain elements, it will be appreciated by those skilled in the art that such disclosures are non-limiting, and that different elements, or combinations thereof, can be provided for such components without departing from the spirit and scope of the present invention.

It will be recognized that the above described invention may be embodied in other specific forms without departing from the spirit or essential characteristics of the disclosure.

Thus, it is understood that the invention is not to be limited by the foregoing illustrative details, but rather is to be defined by the appended claims.

What is claimed is:

1. In combination:
   an integrated circuit provided on a printed circuit board; and
   a lid comprising a wall surrounding the integrated circuit, the lid further comprising a top cover covering the integrated circuit and attached to the printed circuit board, wherein the wall and top cover are provided in a single piece.

2. The combination of claim 1, wherein the integrated circuit is an image sensor.

3. The combination of claim 1, wherein the printed circuit board is provided in a chip-on-board package.

4. The combination of claim 3, wherein the wall of the lid has a bottom edge that is attached to the printed circuit board around the integrated circuit.

5. The combination of claim 3, wherein the wall of the lid has a bottom edge, and wherein the lid further comprises a flange extending radially outwardly from the bottom edge of the wall and the flange having a bottom surface that is attached to the printed circuit board around the integrated circuit.

6. The combination of claim 5, wherein the flange is provided as a single piece together with the wall and top cover.

7. The combination of claim 1, wherein the top cover includes a lens element.

8. The combination of claim 1, further comprising at least one filter layer deposited on the top cover.

9. The combination of claim 8, wherein the filter is an infrared filter.

10. The combination of claim 1, further comprising a lens mount attached to the lid.

11. The combination of claim 1, wherein the wall and top cover are molded into a single piece.

12. The combination of claim 1, wherein the printed circuit board has a surface area, and wherein the lid has a surface area that is smaller than the surface area of the printed circuit board.

13. A method of manufacturing a chip-on-board integrated circuit, comprising the steps of:
   a. soldering a plurality of integrated circuits to a PC-board;
   b. attaching an optical element to the PC-board;
   c. providing a lid comprising a wall and a top cover that are provided in a single piece;
   d. positioning the lid on the PC board at a desired position so that the wall surrounds the optical element and the top cover covers the optical element; and
   e. attaching the lid to the PC board at the desired location.

14. The method of claim 13, wherein step (b) further comprises the step of: incorporating a lens element into the top cover.

15. The method of claim 13, wherein step (b) further comprises the step of: attaching a lens mount to the top cover.

16. The method of claim 13, wherein step (a) further comprises the step of attaching an image sensor to the PC board.

17. The method of claim 13, wherein step (b) further comprises the step of:
   providing a flange extending radially outwardly from a bottom of the wall and having a bottom surface; and
   attaching the bottom surface of the flange to the PC board around the integrated circuit.

18. The method of claim 13, wherein step (b) further comprises the step of: providing one or more layers of filter coatings on the top cover.

19. The method of claim 13, further including:
   providing the PC board with a surface area; and
   providing the lid with a surface area that is smaller than the surface area of the printed circuit board.

20. A lid for protecting and covering an integrated circuit provided on a printed circuit board, the lid comprising a wall and a top cover that are provided in a single piece.

21. The lid of claim 20, wherein the top cover includes a lens element.

22. The lid of claim 20, further comprising at least one filter layer deposited on the top cover.

23. The lid of claim 22, wherein the filter is an infrared filter.

24. The lid of claim 20, further comprising a lens mount attached to the lid.

25. The lid of claim 20, wherein the wall and top cover are molded into a single piece.

26. The lid of claim 20, wherein the wall has a bottom edge, and wherein the lid further comprises a flange extending radially outwardly from the bottom edge of the wall.

27. The lid of claim 26, wherein the flange is provided as a single piece together with the wall and top cover.

28. The lid of claim 20, wherein the lid has a surface area that is smaller than the surface area of a printed circuit board.

* * * * *